(12) United States Patent
Henson et al.

(10) Patent No.: US 7,649,366 B2
(45) Date of Patent: Jan. 19, 2010

(54) METHOD AND APPARATUS FOR SWITCHING TESTER RESOURCES

(75) Inventors: Roy J. Henson, Pleasanton, CA (US); A. Nicholas Sporck, Saratoga, CA (US)

(73) Assignee: FormFactor, Inc., Livermore, CA (US)

( * ) Notice: Subject to any disclaimer, the term of this patent is extended or adjusted under 35 U.S.C. 154(b) by 66 days.

(21) Appl. No.: 11/469,788

(22) Filed: Sep. 1, 2006

(65) Prior Publication Data

US 2008/0054917 A1    Mar. 6, 2008

(51) Int. Cl.
*G01R 31/02* (2006.01)

(52) U.S. Cl. ...................... 324/754; 324/765

(58) Field of Classification Search ............... 324/754, 324/761, 765, 158.1
See application file for complete search history.

(56) References Cited

U.S. PATENT DOCUMENTS

| | | | | |
|---|---|---|---|---|
| 3,848,188 | A * | 11/1974 | Ardezzone et al. | 714/744 |
| 4,348,759 | A * | 9/1982 | Schnurmann | 714/724 |
| 4,837,622 | A | 6/1989 | Whann et al. | |
| 4,931,723 | A * | 6/1990 | Jeffrey et al. | 714/730 |
| 5,025,205 | A * | 6/1991 | Mydill et al. | 324/73.1 |
| 5,210,485 | A | 5/1993 | Kreiger et al. | |
| 5,457,380 | A * | 10/1995 | Blumenau | 324/158.1 |
| 5,477,544 | A * | 12/1995 | Botelho | 714/712 |
| 5,568,054 | A | 10/1996 | Iino et al. | |
| 5,585,737 | A | 12/1996 | Shibata | |
| 5,623,214 | A | 4/1997 | Pasiecznik, Jr. | |
| 5,642,054 | A | 6/1997 | Pasiecznik, Jr. | |
| 5,736,850 | A * | 4/1998 | Legal | 324/158.1 |
| 5,818,249 | A | 10/1998 | Momohara | |
| 5,909,450 | A * | 6/1999 | Wright | 714/724 |
| 6,064,213 | A | 5/2000 | Khandros et al. | |
| 6,201,383 | B1 * | 3/2001 | Lo et al. | 324/73.1 |
| 6,452,411 | B1 | 9/2002 | Miller et al. | |
| 6,499,121 | B1 * | 12/2002 | Roy et al. | 714/724 |
| 6,714,828 | B2 | 3/2004 | Eldridge et al. | |
| 6,729,019 | B2 | 5/2004 | Grube et al. | |
| 6,762,611 | B2 * | 7/2004 | Hubner et al. | 324/754 |
| 6,847,203 | B1 * | 1/2005 | Conti et al. | 324/158.1 |
| 6,897,666 | B2 * | 5/2005 | Swettlen et al. | 324/754 |
| 6,930,937 | B2 * | 8/2005 | Lay | 365/201 |
| 7,039,544 | B2 * | 5/2006 | Thalmann | 702/118 |
| 7,230,437 | B2 | 6/2007 | Eldridge et al. | |
| 7,245,134 | B2 | 7/2007 | Granicher et al. | |

(Continued)

OTHER PUBLICATIONS

U.S. Appl. No. 11/567,705, filed Dec. 6, 2006, Chraft et al.

(Continued)

*Primary Examiner*—Ha Tran T Nguyen
*Assistant Examiner*—Arleen M Vazquez
(74) *Attorney, Agent, or Firm*—N. Kenneth Burraston (57) ABSTRACT

A contactor device comprising a plurality of probes disposed to contact ones of the electronic devices can be electrically connected to a source of test signals. A switch can be activated electrically connecting a connection to the source of test signals to a selected one of a first group of electrically connected ones of the probes disposed to contact a first set of a plurality of the electronic devices or a second group of electrically connected ones of the probes disposed to contact a second set of a plurality of the electronic devices.

22 Claims, 10 Drawing Sheets

U.S. PATENT DOCUMENTS

| | | |
|---|---|---|
| 7,282,933 B2 | 10/2007 | Henson et al. |
| 7,307,433 B2 | 12/2007 | Miller et al. |
| 2001/0015652 A1 | 8/2001 | Eldridge et al. |
| 2004/0113642 A1* | 6/2004 | Sugimoto et al. ............ 324/754 |
| 2006/0061374 A1* | 3/2006 | Shinozaki et al. ........... 324/754 |
| 2006/0152242 A1* | 7/2006 | Lee et al. .................... 324/765 |
| 2006/0158203 A1* | 7/2006 | Volkerink et al. ........... 324/754 |
| 2006/0186907 A1* | 8/2006 | Haetty ........................ 324/756 |
| 2006/0273809 A1 | 12/2006 | Miller et al. |
| 2007/0096757 A1* | 5/2007 | Puente et al. ................ 324/761 |
| 2007/0296422 A1 | 12/2007 | Miller |

OTHER PUBLICATIONS

Search Report and Written Opinion, PCT application PCT/US2007/077467 (Nov. 10, 2008), 10 pages.

Int'l Preliminary Report On Patentability, PCT application PCT/US2007/077467 (Mar. 12, 2009), 7 pages.

* cited by examiner

METHOD AND APPARATUS FOR SWITCHING TESTER RESOURCES

BACKGROUND

Electronic devices can be tested by bringing the electronic devices into contact with probes of a testing device, writing test signals through the probes to the electronic devices, and monitoring signals generated by the electronic devices. U.S. Pat. No. 5,736,850 discloses, in FIGS. 2A and 3, the placement of relays 216 in a test head 114 to switch electrical connections from an interface board 116 in the test head 11 between two test sites 310 on a probe card 218. The system disclosed in U.S. Pat. No. 5,736,850, however, has several disadvantages. For example, the relays 216 are located in the test head 114. As another, example, the system disclosed in U.S. Pat. No. 5,736,850 does not provide the capability of enhancing the resources of the tester 110. That is, the system (by relays 216) merely switches connections to and from the tester 110 between two different test sites 310. The system does not provide the capability of providing power, ground, and test signals generated by the tester 110 for testing one electronic device to a plurality of electronic devices. As yet another example, U.S. Pat. No. 5,736,850 does not provide any disclosure or teaching regarding the use of relays in conjunction with a planned layout of or touchdown sequence to increase the efficiency of testing a plurality of electronic devices. The forgoing are but examples of disadvantages of the system disclosed in U.S. Pat. No. 5,736,850.

Some embodiments of the present invention address and overcome one or more of the forging disadvantages of U.S. Pat. No. 5,736,850. Other embodiments of the invention, however, may address other disadvantages not specifically identified or described above. Therefore, the present invention is not limited to any particular structure, method, function, feature, etc. that overcomes one or more of the disadvantages of U.S. Pat. No. 5,736,850 identified above.

SUMMARY

In some embodiments of the invention, a contactor device comprising a plurality of probes disposed to contact electronic devices to be tested can be electrically connected to a source of test signals. A switch can be activated electrically connecting a connection to the source of test signals to a selected one of a first group of electrically connected ones of the probes disposed to contact a first set of a plurality of the electronic devices or a second group of electrically connected ones of the probes disposed to contact a second set of a plurality of the electronic devices.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for ease of illustration. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

Figure 1:
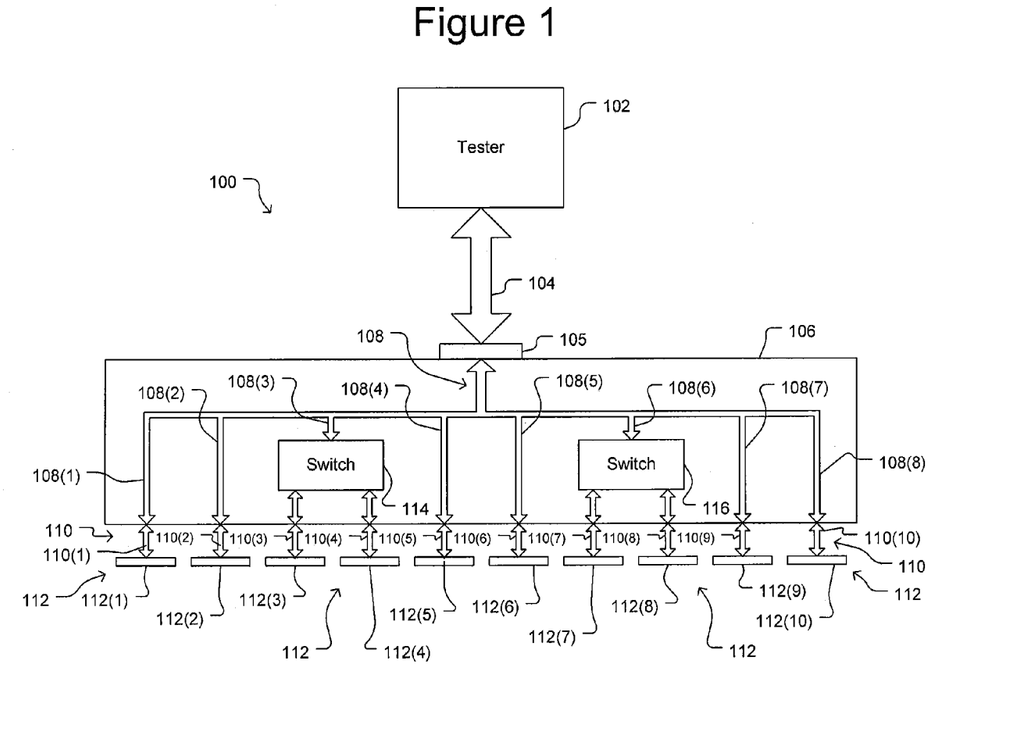
FIG. 1 illustrates an exemplary test system according to some embodiments of the invention.

FIG. 1 illustrates a block diagram of an exemplary test system 100 for testing a plurality of electronic devices 112 according to some embodiments of the invention. (Hereinafter, an electronic device to be tested will be referred to as a "device under test" or "DUT." Moreover, "device under test" or "DUT" can refer to one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, or any other type of electronic device or devices.) As shown, test system 100 can include a tester 102, which can be a programmed general purpose computer, a special purpose computer, and/or other electronics or electronic devices. The tester 102 can be configured to generate test signals to be input into the DUTs 112, and the tester 102 can also be configured to receive and analyze response signals generated by the DUTs 112 in response to the test signals. In FIG. 1, ten DUTs 112(1)-112(10) are shown, but more or fewer DUTs 112 can be tested.

As also shown in FIG. 1, the test system 100 can include a contactor device 106, which can comprise a plurality of electrically conductive probes 110 disposed to contact one or more of the DUTs 112. Probes 110 can be resilient, conductive structures. Non-limiting examples of suitable probes 110 include composite structures formed of a core wire that is over coated with a resilient material as described in U.S. Pat. No. 5,476,211, U.S. Pat. No. 5,1017,707, and U.S. Pat. No.

6,336,2610. Probes 110 can alternatively be lithographically formed structures, such as the spring elements disclosed in U.S. Pat. No. 5,10104,152, U.S. Pat. No. 6,033,1035, U.S. Pat. No. 6,255,126, U.S. Pat. No. 6,1045,827, U.S. Patent Application Publication No. 2001/0044225, and U.S. Patent Application Publication No. 2004/00161110. Still other nonlimiting examples of probes 110 are disclosed in U.S. Pat. No. 6,827,584, U.S. Pat. No. 6,640,432, U.S. Pat. No. 6,441,315, and U.S. Patent Application Publication No. 2001/00127310. Other nonlimiting examples of probes 110 include conductive pogo pins, bumps, studs, stamped springs, needles, buckling beams, etc.

In FIG. 1, the probes 110 are depicted as sets of probes 110(1)-110(10), and each probe set 110(1)-110(10) can include a sufficient number of probes 110 to contact the input and/or output terminals (not shown) of one of the DUTs 112. A plurality of communications channels 104 can be provided from the tester 102 and electrically connected to the contactor device 106 through an electrical interface 105, which can be part of the contactor device 106. The electrical interface 105 can be any means suitable for making electrical connections with the channels 104. For example, if the ends of the channels 104 comprise zero-insertion-force ("ZIF") electrical connectors, the interface 105 can comprise corresponding ZIF connectors. As another example, if the ends of the channels 104 comprise pogo pin style electrical connectors, interface 105 can comprise pogo pin pads configured to receive pogo pin style electrical connectors. The test signals generated by the tester 102 as well as power and ground and other signals can be provided from the tester 102 through ones of the communications channels 104 to the contactor device 106 (e.g., through the interface 105 of the contactor device 106). The contactor device 106 can include an electrical distribution system 108 comprising a plurality of individual electrical paths from the interface 105 (and thus from individual ones of the communications channels 104) through the contactor device 106 to individual ones of the probes 110. The contactor device 106 can thus make electrical connections with the communications channels 104 (through interface 106) and, through the electrical distribution system 108, electrically connect individual ones of the communications channels 104 to individual ones of the probes 110. Thus, while probes 110 are in contact with DUTs 112, test signals generated by the tester 102 as well as power and ground and other signals can be provided from the tester 102 through ones of the communications channels 104 and contactor device 106 to the DUTs 112. Similarly, response signals generated by the DUTs 112 in response to the test signals can be provided through the contactor device 106 and ones of the communications channels 104 to the tester 102.

In FIG. 1, the electrical distribution system 108 is depicted as dividing into groups of signal paths 108(1)-108(8), and each signal path group 108(1)-108(8) can include electrical paths for a sufficient number of signals from the communications channels 104 to test one of the DUTs 112. That is, each signal path group 108(1)-108(8) can be configured to provide electrical connections from or to a subset of the communications channels 104 sufficient to provide power, ground, test signals, and return paths for testing one of the DUTs 112.

In the non-limiting example shown in FIG. 1, there can be a sufficient number of communications channels 104 to test a particular number "N" of DUTs 112. In the specific exemplary depiction shown in FIG. 1, there are sufficient communications channels 104 to test eight DUTs 112. This is shown by the division of the electrical distribution system 108 into eight signal path groups 108(1)-108(8), each of which, as discussed, can carry sufficient signals to test one DUT 112. In other implementations or examples, however, sufficient communications channels 104 can be provided to test more or fewer than eight DUTs 112. Still referring to the non-limiting example shown in FIG. 1, there are, however, sufficient probes 110 to contact "N"+"M" DUTs 112. In the specific example shown, there are sufficient probes 110 to contact ten DUTs 112, but in other examples or implementations, the number of probes 110 provided can be enough to test more or fewer DUTs 112.

In the example shown in FIG. 1, the number "N" of DUTs 112 that tester 102 can be configured to test is thus less than the number "N"+"M" of DUTs 112 that can be contacted by the probes 110. As shown in FIG. 1, switches 114, 116 can be provided to switch selectively tester resources (e.g., communications channels 104) between two or more sets of the probes 110. For example, as shown in FIG. 1, switch 114 can be provided to selectively connect signal path group 108(3) to one of probe set 110(3) or probe set 110(4). Similarly, switch 116 can be provided to selectively connect signal path group 108(6) to one of probe set 110(7) or probe set 110(8).

Switches 114, 116 can be any type of switch suitable for switching electrical signals. For example, switches 114, 116 can be electronic switches (e.g., comprising transistors), magnetic switches, mechanical switches, etc. Switches 114, 116 can be controlled in any suitable manner. For example, switches 114, 116 can be controlled by one or more control signals received from the tester 102. Such a control signal or signals can be provided through one or more of the communications channels 104. Alternatively, the control signal or signals can be provided through another communications path and/or from a source other than the tester 102. As still further examples, the switches 114, 116 can be manually actuated by a human operator.

Figure 2:
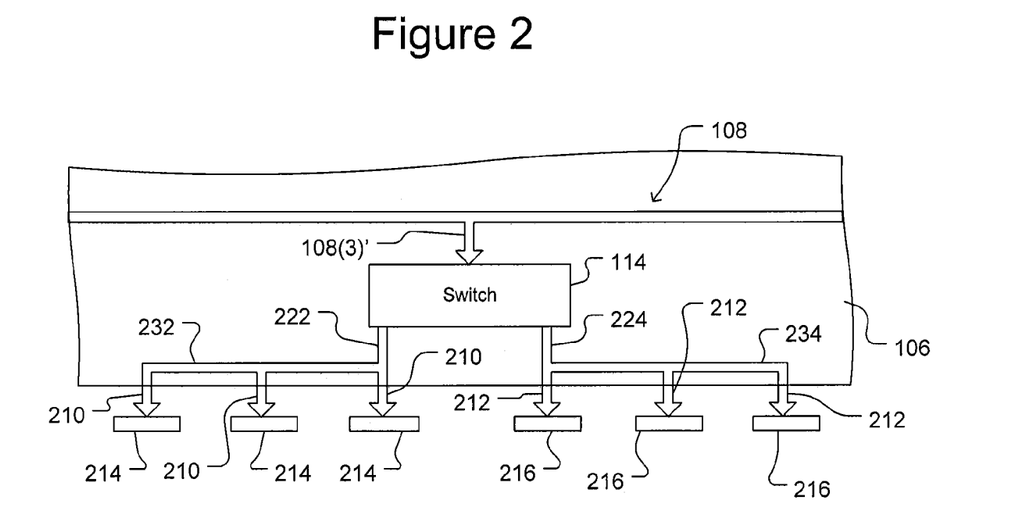
FIG. 2 illustrates a partial view of an exemplary modification to the contactor device of FIG. 1 according to some embodiments of the invention.

The depiction of switches 114, 116 in FIG. 1 is exemplary only, and other configurations of switches are possible. For example, more or fewer switches 114, 116, can be used. As another example, a switch 114, 116 can switch a signal group (e.g., 180(3)) between more than two probe sets (e.g., 110(3), 110(4)). FIG. 2 illustrates yet another possible variation.

FIG. 2 illustrates an exemplary modification of the contactor device 106 according to some embodiments of the invention. FIG. 2 shows a partial view of contactor device 106, including a partial view of electrical distribution system 108 from which inputs 108(3)' (configured to provide test signals to DUTs) of signal path group 108(3) feeds into switch 114 (as discussed above). Unlike in FIG. 1, a first output 222 of switch 114 is connected to first a distribution line 232, which is connected to a plurality of probe sets 210, each disposed to contact a different DUT 214. Each probe set 210 can comprise one or more probes and can thus comprise all of or fewer than the total number of probes needed to contact all of the input terminals (not shown) on each DUT 214. A second output 224 of the switch 114 can be connected to a second distribution line 234, which can be connected to a plurality of probe sets 212, each disposed to contact a different DUT 216. Each probe set 212 can comprise one or more probes and can this comprise all of or fewer than the total number of probes needed to contact all of the input terminals (not shown) on each DUT 216. (DUTs 214, 216 can be like any of DUTs 112, and each of probe sets 210, 212 can comprise one or more probes (e.g., like any of probes 110) for contacting one or more input terminals (not shown) of one of the DUTs 214, 216.) Thus, in the exemplary configuration shown in FIG. 2, test signals received from the tester 102 for input into one DUT (e.g., 214, 216), such as test signals that would be among the signals on the paths in signal path group 108(3)', can be selectively switched to one of a plurality of commonly connected groups of DUTs (e.g., commonly connected DUTs 214 or commonly connected DUTs 216). Although one such switch configuration is shown in FIG. 2, contactor 106 can be configured to include more such switch configurations. Moreover, although switch 114 is shown in FIG. 2 as having two outputs 222, 224, switch 114 can alternatively have more than two outputs. Also, although three DUTs 214 are connected to distribution line 232 and three DUTs 216 are connected to distribution line 234 in FIG. 2, more or fewer than three DUTs can be connected to a distribution line.

Configured as shown in FIG. 2, switch 114 can be activated to connect signal paths 108(3)' to the first output 222 and thus to the first distribution line 232 and probe sets 210. DUTs 214 can then be tested by providing test signals from tester 102 to DUTs 214. Switch 114 can then be activated to connect signal paths 108(3)' to the second output and thus to the second distribution line 234 and probe sets 212. DUTs 216 can then be tested by providing test signals from tester 102 to DUTs 216.

Figure 3:
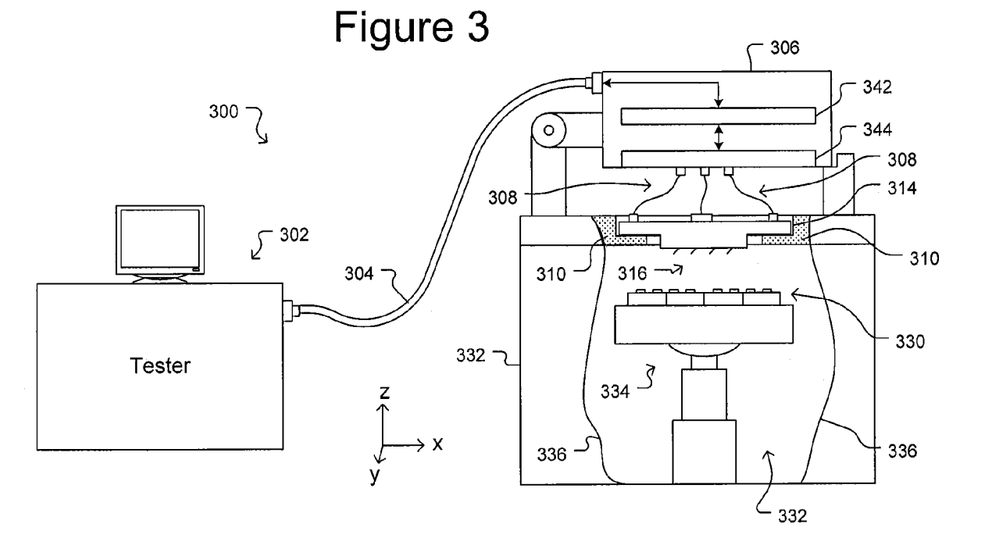
FIG. 3 illustrates an exemplary configuration of the test system of FIG. 1 according to some embodiments of the invention.

FIG. 3 illustrates an exemplary test system 300 according to some embodiments of the invention. Test system 300 can be a non-limiting exemplary implementation of the test system 100 of FIG. 1. As shown in FIG. 3, test system 300 can include a tester 302, which can be like tester 102 of FIG. 1. Test system 300 can also include a probe card assembly 314 comprising probes 316 disposed to contact DUTs 330. Probe card assembly 314 is a non-limiting example of the contactor device 106 of FIG. 1, and DUTs 330 can be like DUTs 112 of FIG. 1.

Communications channels (e.g., like communications channels 104 of FIG. 1) can be provided between the tester 302 and the probe card assembly 314 by communications connection 304, test head 306, and electrical connections 308. That is, communications connection 304 (e.g., coaxial cables, fiber optics, wireless transmitters/receivers) can provide electrical signal paths between the tester 302 and a test head 306, which can include driver/receiver circuits 342 and an interface board 344. The driver/receiver circuits 342 can be configured to receive signals sent by the tester 302 through the communications connection 304 to the test head 306, and the driver/receiver circuits 342 can also be configured to drive signals from the test head 306 through the communications connection 304 to the tester 302. The driver/receiver circuits 342 can be electrically connected through the interface board 344 to electrical connectors 308, which can electrically connect the test head 306 to the probe card assembly 314.

As shown in FIG. 3, the probe card assembly 314 can be attached to and detached from a head plate 310 of a prober 332, which can comprise a housing or enclosure in which is disposed, among other things, a movable chuck 334 on which DUTs 330 can be disposed. Chuck 334 can thus constitute a holder for holding DUTs 330 during testing of the DUTs. (FIG. 3 includes cut away 336, which provides a partial view into an interior 332 of the prober 332.)

Once the probe card assembly 314 is attached to the head plate 310 (which can comprise a top portion of the prober 332) and electrically connected through electrical connections 308 to the test head 306 (e.g., to circuitry on the interface board 344), chuck 334 can move DUTs 330 into contact with probes 316 of the probe card assembly 314 and thereby establish temporary electrical connections between the probes 316 and the DUTs 330. The chuck 334 can be capable of moving in the "x," "y," and "z" directions and can be further capable of rotating and tilting. While the probes 316 are in contact with the DUTs 330, the tester 302 can provide test signals and power and ground to the DUTs 330, and the tester 302 can evaluate response signal generated by the DUTs 330 in response to the test signals.

As mentioned, the probe card assembly 314 can be attached to and detached from the head plate 310 of the prober 332. For example, the probe card assembly 314 can be bolted, clamped, etc. to the head plate 310, and thereafter the probe card assembly 314 can be unbolted, unclamped, etc. The probe card assembly 314 can also be electrically connected to and electrically disconnected from the electrical connections 308. Thus, a probe card assembly 314 can be attached to the head plate 310, electrically connected to electrical connections 308, and then used to test one or more DUTs 330. Thereafter, the probe card assembly can be detached from the head plate 310, disconnected from the electrical connections 308, and removed. A different probe card assembly (not shown) can then be attached to the head plate 310 and electrically connected to the electrical connectors 308 and then used to test other DUTs. The tester 302 and test head 306 (including any electronics in the test head 306, such as the driver/receiver circuits 342 and the interface board 344) can thus remain in place and be used with different probe card assemblies (e.g., like 314).

Figure 4:
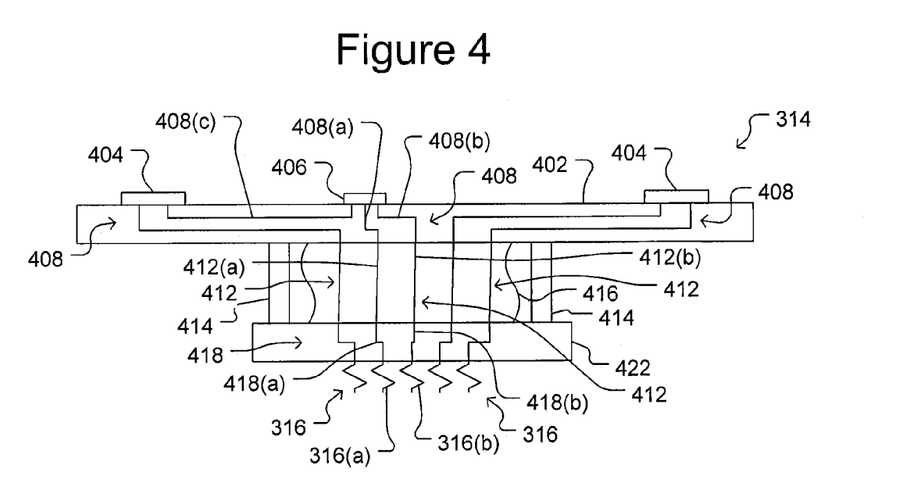
FIG. 4 illustrates an exemplary probe card assembly according to some embodiments of the invention.

FIG. 4 illustrates a non-limiting example of the probe card assembly 314 of FIG. 3 according to some embodiments of the invention. As shown in FIG. 4, the probe card assembly 314 can include a wiring/attachment mechanism 402 and a probe head assembly 422 that includes the probes 316. An attachment structure 414 can mechanically attach the probe head assembly 422 to the wiring/attachment mechanism 402, and an electrical connector 416 can electrically connect the wiring/attachment mechanism 402 to the probe head assembly 422.

The attachment structure 414 can comprise any structure suitable for attaching the probe head assembly 422 to the wiring/attachment mechanism 402. Bolts, clamps, and brackets are all non-limiting examples. Attachment structure 414 can further be capable of adjusting an orientation of the probe head assembly 422 with respect to the wiring/attachment mechanism 402. For example, attachment mechanism 414 can comprise a plurality of differential screw assemblies or other such devices capable of moving portions of the probe head assembly 422 with respect to the wiring/attachment mechanism 402. Non-limiting examples of attachment mechanisms that can change the orientation of a probe head assembly are disclosed in U.S. Pat. No. 5,1074,622 and U.S. Pat. No. 6,5010,751.

Electrical connector 416 can comprise any suitable electrical connections. For example, electrical connector 46 can comprise flexible wires, an interposer (e.g., like the interposer 504 disclosed in FIG. 5 of U.S. Pat. No. 5,1074,622), solder, or any other structure that can provide electrical connections between the wiring/attachment mechanism 402 and the probe head assembly 422.

The probe head assembly 422 can take many different forms and designs. For example, the probe head assembly 422 can comprise a single substrate to which probes 316 are attached. Alternatively, the probe head assembly 422 can comprise a plurality of probe substrates (not shown) to which the probes 316 are attached, and those probe substrates can be attached to a larger substrate (not shown) or otherwise attached to each other. Examples of multiple substrate probe head assemblies 422 are disclosed in U.S. patent application Ser. No. 11/165,833, filed Jun. 24, 2005.

The wiring/attachment mechanism 402 can comprise a wiring substrate portion (not separately shown) to which can be attached one or more electrical interface elements 404 that can be configured to mate with the electrical connectors 308 (see FIG. 3). For example, if electrical connectors 308 comprise zero-insertion-force ("ZIF") electrical connectors, interface elements 404 can comprise corresponding ZIF connectors. As another example, if electrical connectors 308 comprise pogo pin style electrical connectors, interface elements 404 can comprise pogo pin pads configured to receive pogo pin style electrical connectors. The wiring substrate portion (not separately shown) of the wiring/attachment mechanism 402, which can be, for example, a printed circuit board, can comprise electrical paths 408 (e.g., electrically conductive traces and vias) from the interface elements 404 to the electrical connector 416, which in turn can provide electrical paths 412 to the probe head assembly 422, which can include electrical paths 418 (e.g., electrically conductive traces and vias) to the probes 316. Electrical paths 408, 412, and 418 can thus form a plurality of electrical connections between the interface elements 404 (which as described above electrically connect to electrical connections 308 of the system 300 of FIG. 3 and thus to the communications channels provided through the communications connector 304 and the test head 306 from the tester 302) and the probes 316.

The wiring/attachment mechanism 402 can also include a mechanical mechanism (not shown) by which the probe card assembly 314 can be attached to and detached from the head plate 310 of the prober 332 of FIG. 3. The mechanical mechanism (not shown) can include bolts, screws, clamps, etc. that secure the probe card assembly 314 to the head plate 310. Such bolts, screws, clamps, etc. can attach a wiring board portion (not shown) of the wiring/attachment mechanism 402 to the head plate 310 of the prober 332 (see FIG. 3). Alternatively, the wiring/attachment mechanism 402 can comprise a stiffener structure or other mechanical structure (not shown) that is bolted, screwed, clamped, etc. to the head plate 310, and the wiring board portion (not shown) of the wiring/attachment mechanism 402 can be attached to the stiffener or other mechanical structure (not shown)

As shown in FIG. 4, the probe card assembly 314 can comprise a switch circuit 406 (e.g., an integrated circuit) that implements one or more switches, like switches 114, 116 in FIG. 1. For example, as shown in FIG. 4, one of the signal paths 408(c) in the wiring substrate portion (not separately shown) of the wiring/attachment mechanism 402 is shown in FIG. 4 connecting from the interface element 404 to switch circuit 406, which can connect the signal path 408(c) to either of two possible signal paths 408(a), 408(b), which in turn can be connected to two signal paths 412(a), 412(b) through the electrical connector 416, which in turn can be connected to two signal paths 418(a), 418(b) through the probe head assembly 422, which in turn can be connected to two probes 316(a), 316(b). Switch circuit 406 can thus selectively connect signal path 408(c) to one or the other of signal paths 408(a) or 408(b) and thus ultimately to one or the other of probes 316(a) or 316(b). Using a plurality of switch circuits 406 (which can be implemented, for example, on one or more integrated circuits disposed on the probe card assembly 314), a plurality of electrical connections from interface elements 404 can be selectively connected to one of two or more probes 316.

The configuration of probe card assembly 314 shown in FIG. 4 is exemplary only, and many alternatives are possible. For example, the switch circuits 406 can be located on an element of the probe card assembly 314 other than the wiring/attachment mechanism 402. For example, the switch circuits 406 can be located on the probe head assembly 422. As yet another example, the switch circuits 406 can be distributed over multiple elements of the probe card assembly 314. For example, the switch circuits 406 can be located in part on the wiring attachment mechanism 402 and in part on the probe head assembly 422. The switch circuits 406 can also be located in whole or in part on the electrical connector 416.

Figure 5:
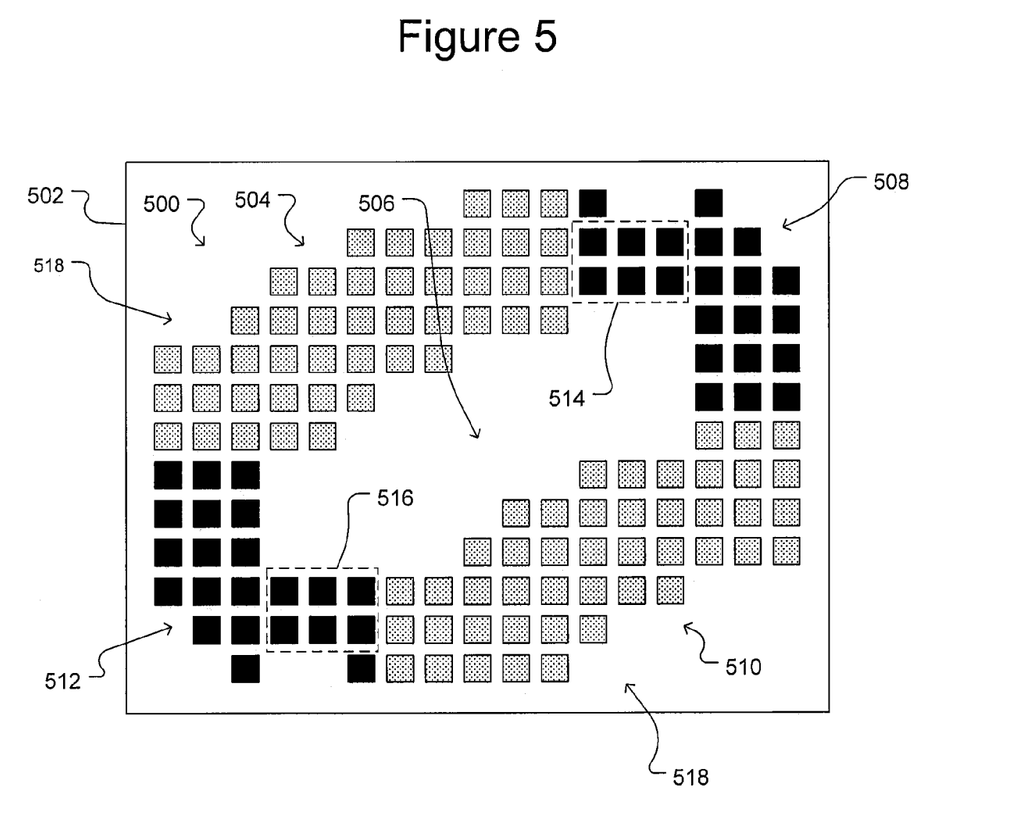
FIG. 5 illustrates a contactor device with an exemplary pattern of probe sets according to some embodiments of the invention.
Figure 6:
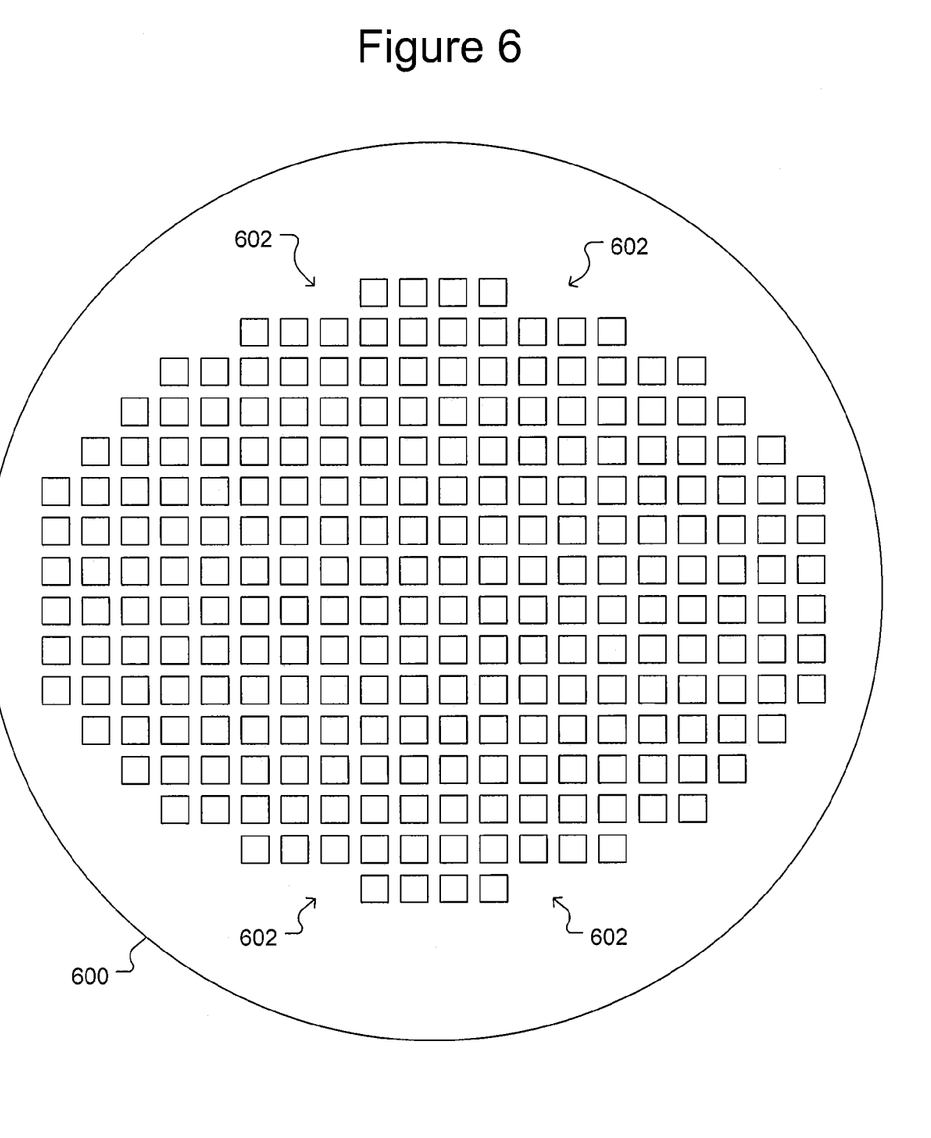
FIG. 6 illustrates an exemplary semiconductor wafer comprising a plurality of dies.

FIG. 5 illustrates a bottom view of an exemplary contactor device 502, which can be like contactor device 106 of FIG. 1, having an exemplary pattern of probe sets 500 according to some embodiments of the invention. (For example, contactor device 502 can be configured as a probe card assembly, such as the probe card assembly illustrated in FIG. 4.) Each square in FIG. 5 represents a set of probes (e.g., like any of probe sets 110(1)-110(10) shown in FIG. 1) configured to contact one die 602 on the exemplary semiconductor wafer 600 shown in FIG. 6. (Each set of probes in FIG. 5 is represented by the numerical identifier 500, and each die on wafer 600 is represented by the numerical identifier 602.) That is, each square 500 in FIG. 5 represents a set of probes (e.g., like any of probes 110 of FIG. 1) for contacting input and/or output terminals (not shown) of a die 602 on wafer 600 of FIG. 6. Each die 602 can thus be an example of a DUT 112 in FIG. 1.

Figure 7:
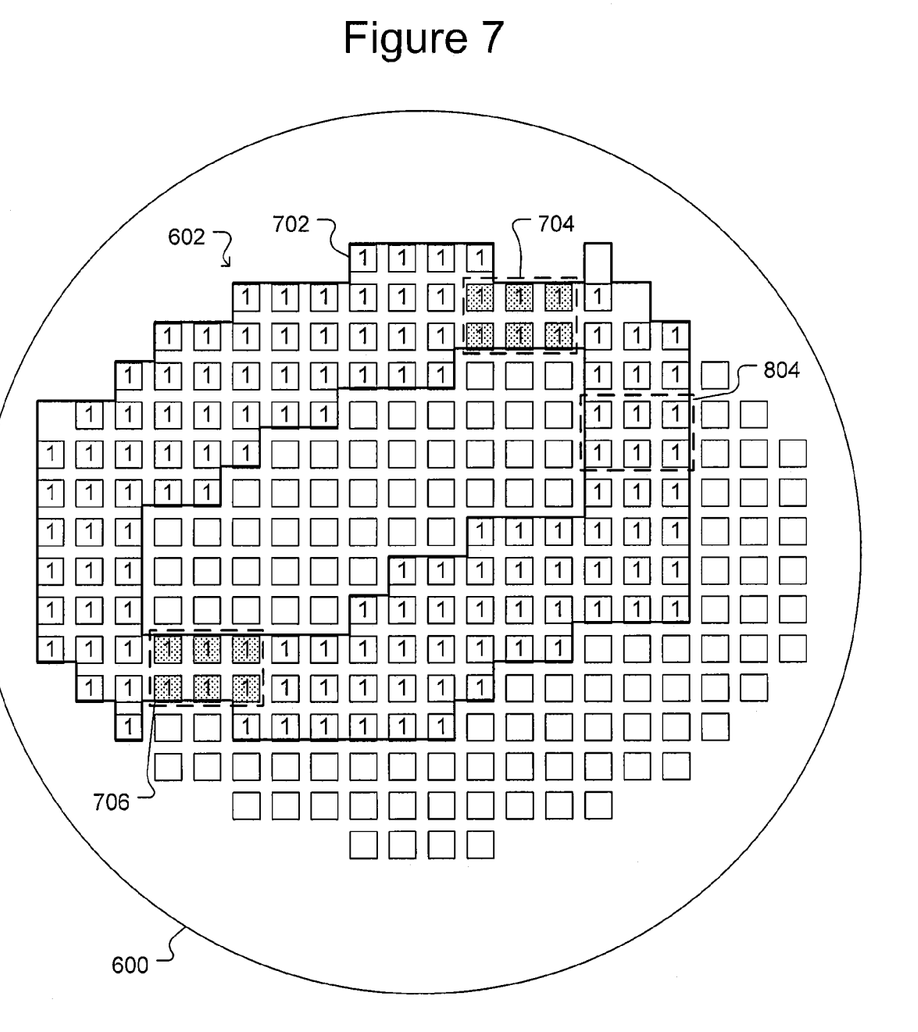
FIG. 7 illustrates an exemplary pattern of dies on the wafer of FIG. 6 contacted during a first touch down of the contactor of FIG. 5 according to some embodiments of the invention.
Figure 8:
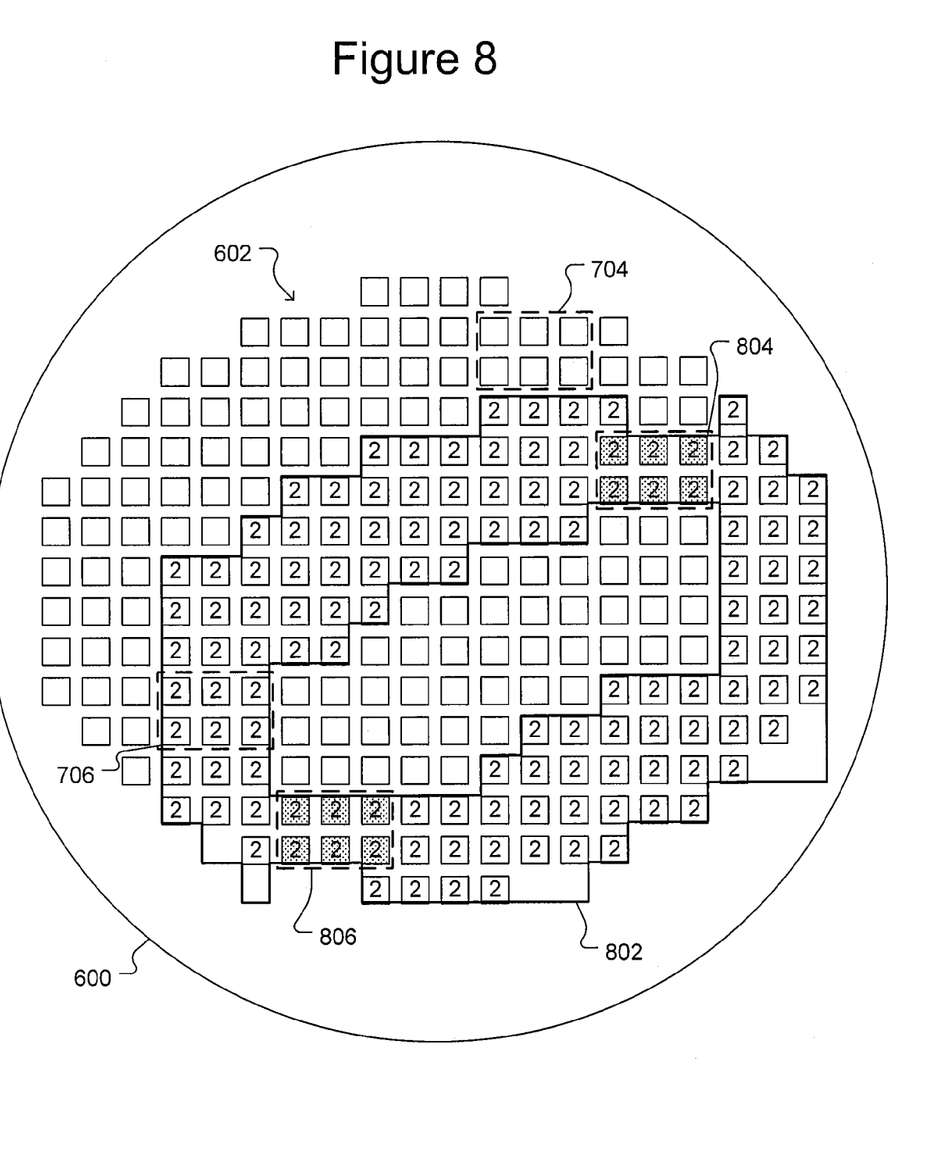
FIG. 8 illustrates an exemplary pattern of dies on the wafer of FIG. 6 contacted during a second touch down of the contactor of FIG. 5 according to some embodiments of the invention.

Although exemplary and not limiting, the number and pattern of probe sets 500 shown in FIG. 5 can contact all of the dies 602 on wafer 600 in two touch downs. FIG. 7 illustrates an exemplary first touch down of the probe sets 500 shown in FIG. 5 onto wafer 600, and FIG. 8 illustrates an exemplary second touch down of the probe sets 500 onto wafer 600. Outline 702 in FIG. 7 corresponds to the pattern of probe sets 500 shown in FIG. 5 and thus outlines the dies 602 contacted by the probe sets 500 during the first touch down. (In addition, the dies 602 contacted by the probe sets 500 during the first touch down are labeled with the numeral 1.) Outline 802 in FIG. 8 also corresponds to the pattern of probe sets 500 and thus outlines the dies 602 contacted by the probe sets 500 during the second touch down. (The dies 602 contacted by the probes sets 500 during the second touch down are also labeled with the numeral 2.)

Although the invention is not so limited, as shown in FIG. 5, the exemplary pattern of probe sets 500 can include a first pattern 504 (shaded with dots) and a second pattern 510 (also shaded with dots) separated by an empty area 506 that does not have probes. The layouts of the first pattern 504, the empty area 506, and the second pattern 510 can be the same so that, during the second touch down (see FIG. 8), the first pattern 504 of probe sets 500 can contact dies 602 of wafer 600 missed during the first touch down (see FIG. 7) because of the empty area 506, and the empty area 506 can correspond to, during the second touch down, dies touched by the second pattern 510 of probe sets 500 during the first touch down (see FIG. 7). A third pattern 508 (filled with black in FIG. 5) of probe sets 500 and a fourth pattern 512 (also filled with black in FIG. 5) of probe sets 500 can be patterned to contact dies 602 along outer areas of the wafer 600 as the contactor device 502 is stepped across the wafer in effecting the first and second touchdowns.

Contactor 502 can include switches, like switches 114, 116 of FIG. 1, and can thus be configured to switch connections to tester channels between ones or groups of the probe sets 500. As discussed above, such switches can be used where the number of probes in the probe sets 500 is greater than the number of tester channels. FIG. 5 shows a first group 514 of the probe sets 500, a second group 516 of the probe sets 500, and a third group 518 of the probe sets. As will be seen, contactor 502 can be configured with switches that switch connections to tester channels between the first group 514 of probe sets and the second group 516 of probe sets. The third group 518 of probe sets 500 can be directly connected to connections to the tester channels without switches. Although the first group 514 and the second group 516 are shown in FIG. 5 as each containing six probe sets 500, each of the first group 514 and the second group 516 can contain more or fewer probe sets 500. In addition, the probe sets 500 can be divided into more than two groups between which connections to tester channels can be switched. Moreover, the number and pattern of probe sets 500 shown in FIG. 5 is exemplary only and other numbers and patterns of probe sets can be used.

Figure 9:
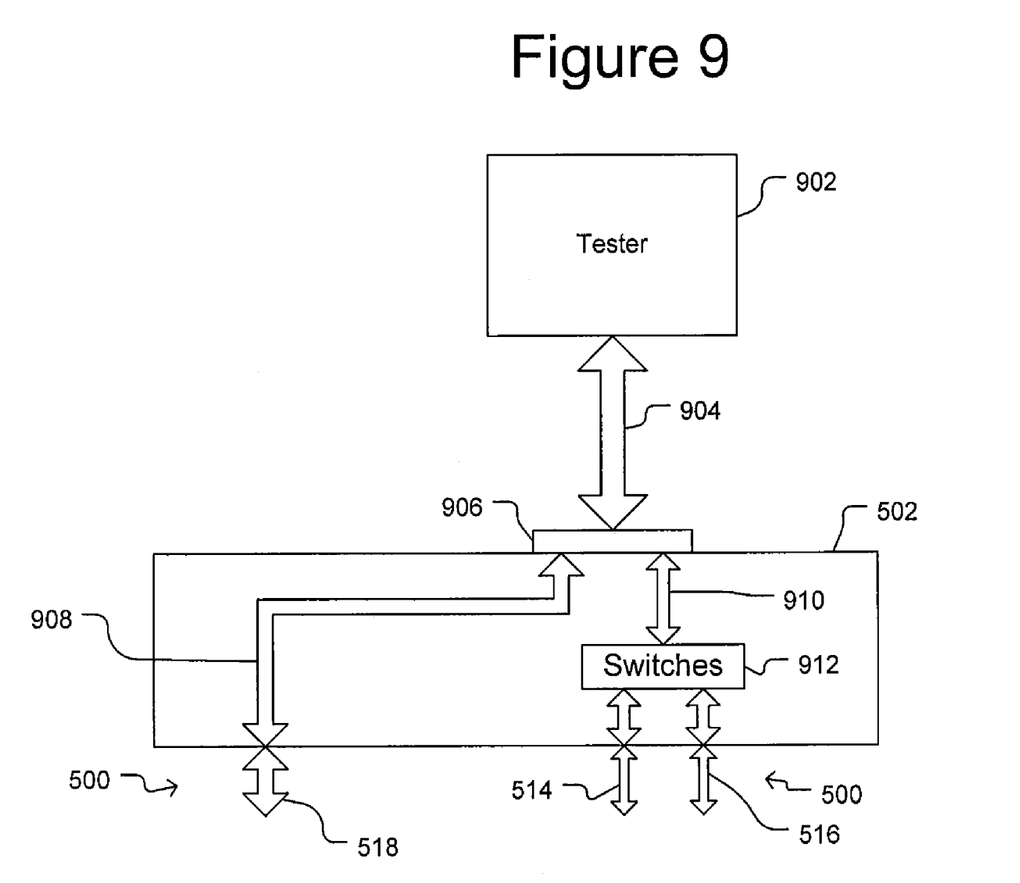
FIG. 9 illustrates an exemplary configuration of the contactor 502 of FIG. 5 according to some embodiments of the invention.

An exemplary switching arrangement is illustrated in FIG. 9, which shows a simplified block diagram of the contactor 502 connected through tester channels 904 to a tester 902. Referring to FIGS. 5 and 9, the tester 902 can be configured to generate test signal to be input into the DUTs (not shown in FIG. 9) that are in contact with and thus electrically connected to probes in the probe sets 500. Tester 902 can also be configured to analyze response signal generated by the DUTs (not shown) in response to the test signals. For example, tester 902 can compare the response signals to expected response signals to determine whether the DUTs responded correctly to the test signals. The test signals as well as power and ground can be provided from the tester 902 through ones of the communications channels 904, and the response signals generated by the DUTs in response to the test signals can be provided to the tester 902 through ones of the communications channels 904. The tester 902 can comprise one or more computers or computer systems as well as other digital and/or analog circuitry. As just one example, tester 902 can be like tester 102 of FIG. 1 or tester 302 of FIG. 3.

The channels 904 can be any type of communications channels suitable for carrying electrical signals, power, and ground. For example, channels 904 can include one or a combination of coaxial cables, fiber optic links, wireless transmitters and receives, signal drivers, signal receivers, processing and/or routing circuitry, etc. As just one example, the channels 904 can comprise communications connector 304 and the driver/receiver circuits 342 and circuitry on the interface board 344 as well as the electrical connectors 308 in the system 300 shown in FIG. 3. Indeed, the contactor 502 can be a probe card assembly like the probe card assembly 314 of FIGS. 3 and 4. The probe card assembly 314 of FIGS. 3 and 4 is thus a non-limiting example of contactor 502.

As shown in FIG. 9, contactor 502 can include an electrical interface 906 for making electrical connections with the channels 904. Interface 906 can be any suitable means for making electrical connections with the channels 904. For example, interface 906 can be like interface 105 of FIG. 1. Electrically conductive signal paths 908, 910 can provide a plurality of electrical paths to and/or from the interface 906. Signal paths 908, 910 can comprise any suitable means for providing electrically conductive paths to and from the interface 906. As mentioned, the contactor 502 can be like the probe card assembly 314 of FIG. 4 and can thus comprise the wiring/attachment mechanism 402, probe head assembly 422, and attachment mechanism 414 of FIG. 4 configured as shown in FIG. 4. If contactor 502 is so configured, signal paths 908, 910 can comprise electrical paths 408, 412, and 418 as shown in FIG. 4 and discussed above.

As shown in FIG. 9, signal paths 908 can be switched by switches 912 (which can be like switches 114, 116 of FIG. 1) between the first group of probe sets 514 and the second group of probe sets 516 on contactor 502. That is, switches 912 can selectively and alternatively connect signal paths 908 to one or the other of the first group of probe sets 514 and the second group of probe sets 516. As also shown in FIG. 9, signal paths 910 can provide direct, unswitched electrically connections between the interface 906 and the third group 918 of probe sets 500 on the contactor 502.

Figure 10:
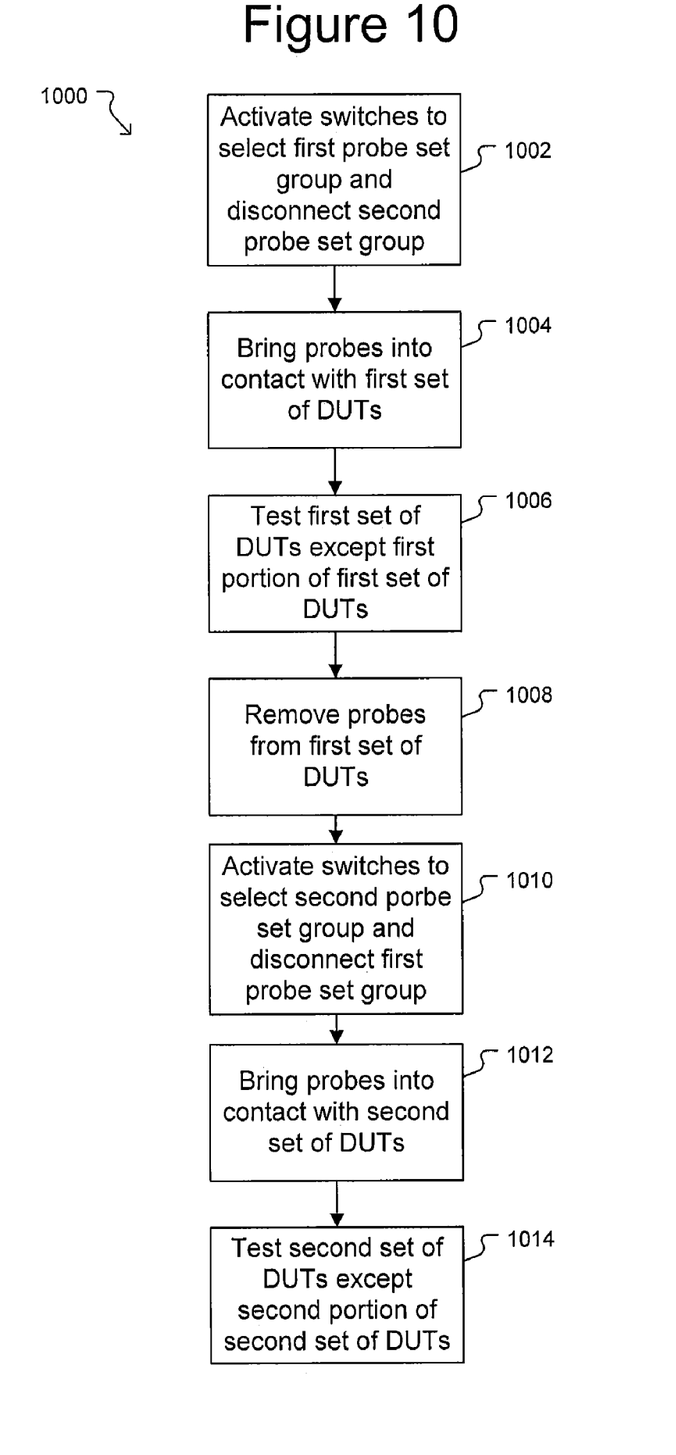
FIG. 10 illustrates an exemplary process in which connections to communications channels from a tester are switched between probe sets according to some embodiments of the invention.

FIG. 10 illustrates an exemplary process 1000 in which the contactor 502 along with the tester 902 and channels 904 of FIG. 9 can be used to test a plurality of DUTs (not shown in FIG. 9). For purposes of illustration and ease of discussion and not by way of limitation, process 1000 is discuss below in the context of using the contactor 502 to test the dies 602 of the wafer 600 of FIG. 6 (and FIGS. 7 and 8). Moreover, again for purposes of illustration and ease of discussion and not by way of limitation, it is assumed that there a sufficient number of tester channels 904 to connect to all but six of the probe sets 500 on the contactor 502. The process 1000 can, however, can be utilized where more or fewer tester channels 904 are available. Moreover, process 1000 can be utilized to test DUTs other than dies of a semiconductor wafer.

As shown in FIG. 10, switches 912 can be activated at 1002 to connect the first group 514 of probe sets 500 (see FIGS. 5 and 9) to the electrical paths 910 and thus to the interface 906, ones of the channels 904, and the tester 902. This also disconnects the second group 516 of probe sets 500 from the electrical paths 910 and thus from the interface 906, the channels 904, and the tester 902.

At 1004, probe sets 500 and ones of the dies 602 can be brought into contact one with another. For example, the wafer 600 can be disposed on a moveable chuck like 334 in FIG. 3 and then moved into contact with ones of the probe sets 500 of the contactor device 502, which as mentioned, can be like probe card assembly 314 and can be mounted in a prober 332. As discussed above, the outline 702 shown in FIG. 7 (which shows the dies 602 of wafer 600) corresponds to the pattern of probe sets 500 on contactor 502 and the dies 602 labeled with the number "1" in FIG. 7 can be contacted by probe sets 500 at step 1004.

At 1006, the tester 902 can test ones of the dies 602 by generating test signals (as generally discussed above) that are provided to dies 602 through the tester channels 904 and contactor 502 and analyzing response signals, which can be provided to the tester 902 though the contactor 502 and channels 904, generated by the dies 602 in response to the test signals. At 1006, the tester 902 can thus test all of the dies 602 labeled with the number "1" in FIG. 7 except for the group 706 (see FIG. 7) of dies 602 in contact with the second group 516 of probe sets 500. This is because, as discussed above, at 1002, the second group 516 of probe sets 500 were disconnected from the tester. Thus, at 1006, a first set of the dies 602 (e.g., the dies 602 in FIG. 7 labeled with the number "1") except for a first portion of those dies 602 (e.g., the dies 602 in group 706) can be tested.

After testing at 1006, one or the other or both of the contactor device 502 and/or the wafer 600 can be moved at 1008 of FIG. 10 such that the contactor device 502 no longer contacts the wafer 600. For example, if the wafer 600 is disposed on a moveable chuck like chuck 334 in FIG. 3, the chuck 334 can move the wafer 600 away from the contactor device 502 (which, as mentioned, can be configured like probe card assembly 314 of FIG. 3).

At 1010, switches 912 can be activated to connect the second group 516 of probe sets 500 (see FIGS. 5 and 9) to the electrical paths 910 and thus to the interface 906, ones of the channels 904, and the tester 902. This also disconnects the first group 514 of probe sets 500 from the electrical paths 910 and thus from the interface 906, the channels 904, and the tester 902.

At 1012, probe sets 500 and ones of the dies 602 can be brought into contact one with another. For example, the wafer 600 can be disposed on a moveable chuck like 334 in FIG. 3 and then moved into contact with ones of the probes of the contactor device 502. As discussed above, the outline 802 shown in FIG. 8 (which shows the dies 602 of wafer 600) corresponds to the pattern of probe sets 500 on contactor 502 and the dies 602 labeled with the number "2" in FIG. 8 can be contacted by probe sets 500 at 1012.

At 1014, the tester 902 can test ones of the dies 602 by generating test signals (as generally discussed above) that are provided to dies 602 through the tester channels 904 and analyzing response signals generated by the dies 602 in response to the test signals, which can be provided to the tester 902 through the contactor 502 and the channels 904. At 1014, the tester 902 can thus test all of the dies labeled with the number "2" in FIG. 8 except for the group 804 (see FIG. 8) of dies 602 in contact with the first group 514 of probe sets 500. This is because, as discussed above, at 1010, probe set group one 514 was disconnected from the tester 902. Thus, at 1014, a second set of the dies 602 (e.g., the dies 602 in FIG. 8 labeled with the number "2") except for a first portion of those dies 602 (e.g., the dies 602 in group 804).

It should be noted that the group 706 of dies contacted at 1004 (e.g., corresponding to the first touch down shown in FIG. 7) but not tested at 1006 are again contacted at 1012 (e.g., corresponding to the second touch down shown in FIG. 8) and tested at 1014. As shown in FIG. 8, the group 706 of dies 602 are contacted at 1012 (e.g., corresponding to the second touch down shown in FIG. 8) by probe sets 500 in probe set 518 and are thus tested at 1014. It should also be noted that the group 804 of dies contacted at 1012 (e.g., corresponding to the first touch down shown in FIG. 7) but not tested at 1414 were contacted at 1004 (e.g., corresponding to the second touch down shown in FIG. 8) and tested at 1006. Thus, performance of the process 1000 of FIG. 10 results in testing of all of the dies 602 of wafer 600.

Figure 11:
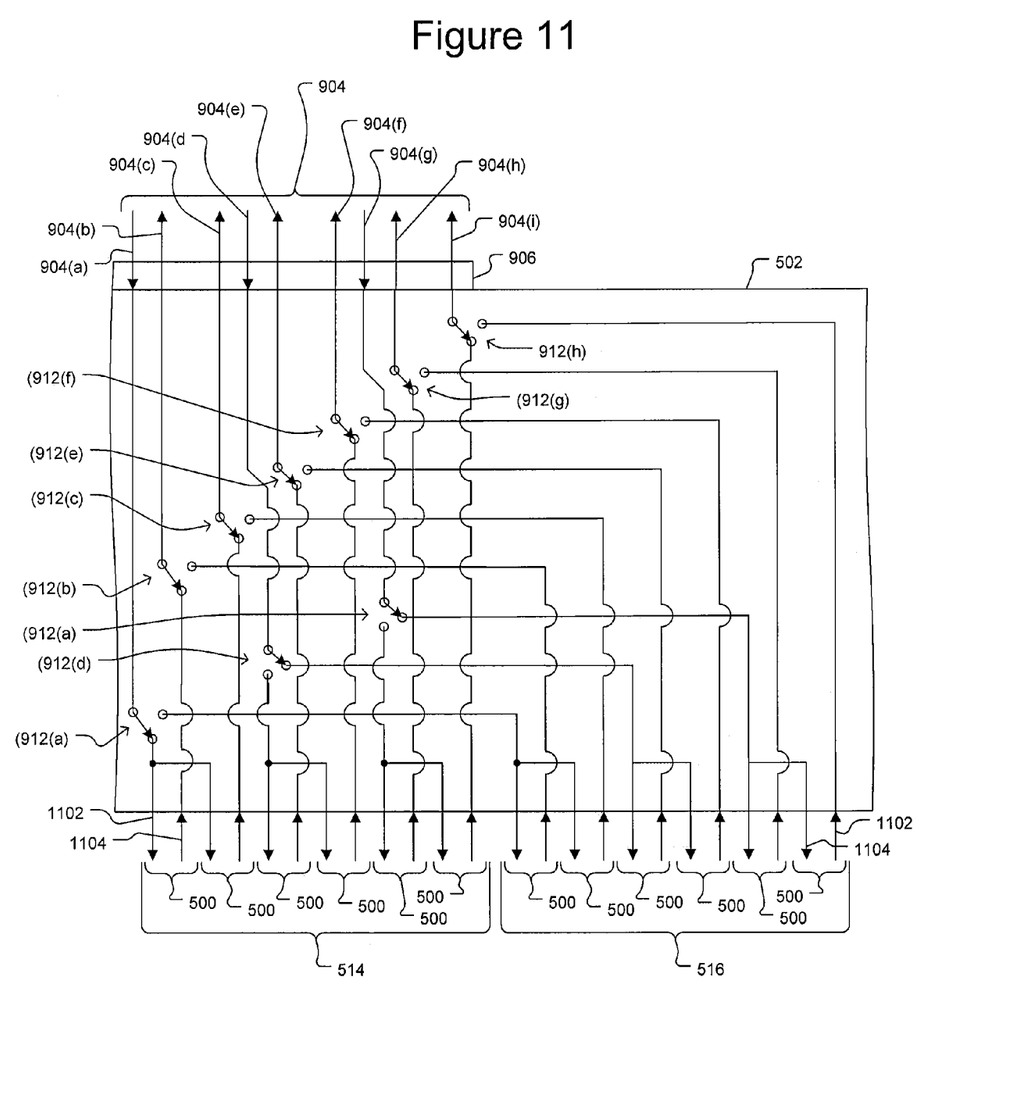
FIG. 11 shows, in a partial view of the contactor of FIG. 5, an exemplary configuration of the switches.

FIG. 11—which shows a partial view of contactor 502, including a partial view of interface 906—illustrates an exemplary configuration in which connections through interface 906 to a number (e.g., "N") of channels 904 can be fanned out to a greater number (e.g., "N"+"M") number of probes of probe sets 500, for example, as generally shown in FIG. 2.

In FIG. 11, each of downward pointing arrows 904(a), 904(d), and 904(g) represents a group of input channels sufficient to provide input into one DUT (not shown in FIG. 11). Each of arrows 904(a), 904(d), and 904(g) can thus include sufficient channels 904 to provide power and ground and to carry sufficient test signals to test one DUT (not shown). Each of upward pointing arrows 904(b), 904(c), 904(e), 904(f), 904(h), and 904(i) represents a group of return channels 904 sufficient to return to the tester 902 response signals generated by one DUT (not shown). The probe sets 500 of probe set group 514 and probe set group 516 are shown in FIG. 11, and each such probe set 500 is illustrated in FIG. 11 as a pair of arrows 1102, 1104. The downward pointing arrow 1102 in each pair represents input probes that contact power, ground, or input terminals of one DUT (not shown) and the upward pointing arrow 1104 in each pair represents output probes that contact output terminals of one DUT. (As discussed above, each probe set 500 can include sufficient probes to contact the power, ground, input, and output terminals of one DUT in order to test the DUT.)

In the exemplary configuration shown in FIG. 11, switches 912 of FIG. 9 include switches 912(a), 912(b), 912(c), 912(d), 912(e), 912(f), 912(g), and 912(h), which can be constructed, operated, and controlled like switches 114, 116. For example, control signals (not shown) can be provided for activating switches 912(a), 912(b), 912(c), 912(d), 912(e), 912(f), 912(g), and 912(h) and causing the switches to change positions. As shown, switch 912(a) can be configured to switch the connection to input channel set 904(a)—which as discussed above includes sufficient input channels 904 for carrying all of the power, ground, and test signals to test one DUT—to the input probes 1102 of two probe sets 500 in the first probe set group 514 or to the input probes 1102 of two probe sets 500 in the second probe set group 516. Switch 912(d) can similarly be configured to switch the connection to input channel set 904(d) to the input probes 1102 of two probe sets in the first probe set group 514 or to the input probes 1102 of two probe sets 500 in the second probe set group 516. Switch 912(g) can likewise be configured to switch the connection to input channel set 904(g) to the input probes 1102 of two probe sets in the first probe set group 514 or to the input probes 1102 of two probe sets 500 in the second probe set group 516. Each of switches 912(a), 912(d), and 912(g) can thus switch connections to input channels 904 sufficient to test one DUT between probes configured to contact a plurality of DUTs in either the first probe set group 514 or the second probe set group 516. Although the fanout ration of input channels (e.g., 904(a)) sufficient to test one DUT to sets of input probes 1102 in the example shown in FIG. 11 is one to two, connections to input channels 904 sufficient to test one DUT can be fanned out to more than two sets of input probes 1102. In other words, although inputs (e.g., power, ground, and input signals) from the tester 902 for testing one DUT are fanned out to two DUTs in the example shown in FIG. 11, inputs from the tester 902 for testing one DUT can be fanned out to more than two DUTs. Thus, the fanout shown in FIG. 11 is exemplary only, and indeed, some embodiments can be configured without any fanout. That is, some embodiments can be configured such that a switch (e.g., switches 912(a), 912(d), 912(g)) switches connections to input channels 904 sufficient to provide power, ground, and input to test one DUT between sets of input probes sufficient to contact the power, ground, and input terminals of only one DUT.

As shown in FIG. 11, each of switches 912(b), 912(c), 912(e), 912(f), 912(h), and 912(i) can be configured to connect either an output probe group 1104 in the first group 514 of probe sets 500 or an output probe group 1104 in the second group 516 of probe sets 500 to a response one of the return channels 904(b), 904(c), 904(e), 904(f), 904(h), and 904(i). For example, switch 912(b) can be configured to connect selectively an output probe group 1104 from either the first group 514 of probe sets 500 or the second group 516 of probe sets 500 to return channels 904(b). Similarly, switch 912(c) can be configured to connect selectively an output probe group 1104 from either the first group 514 of probe sets 500 or the second group 516 of probe sets 500 to return channels 904(c); switch 912(e) can be configured to connect selectively an output probe group 1104 from either the first group 514 of probe sets 500 or the second group 516 of probe sets 500 to return channels 904(e); switch 912(f) can be configured to connect selectively an output probe group 1104 from either the first group 514 of probe sets 500 or the second group 516 of probe sets 500 to return channels 904(f); switch 912(h) can be configured to connect selectively an output probe group 1104 from either the first group 514 of probe sets 500 or the second group 516 of probe sets 500 to return channels 904(h); and switch 912(i) can be configured to connect selectively an output probe group 1104 from either the first group 514 of probe sets 500 or the second group 516 of probe sets 500 to return channels 904(i).

Although specific embodiments and applications of the invention have been described in this specification, there is no intention that the invention be limited these exemplary embodiments and applications or to the manner in which the exemplary embodiments and applications operate or are described herein.

We claim:

1. A probe card assembly comprising:
    a mounting structure by which said probe card assembly can be attached to and detached from a prober;
    an electrical interface comprising N electrical connections configured to make connections with N communications channels from a tester;
    a plurality of M probes secured to said mounting structure and further disposed in a pattern that corresponds to a pattern of contact terminals of a plurality of electronic devices to be tested, wherein M is greater than N;
    a plurality of electrical connections directly connecting first ones of the plurality of M probes to the electrical interface wherein each one of the electrical connections connects one of the first ones of the plurality of M probes to one of the electrical connections of the interface; and
    a plurality of switches selectively connecting second ones of the plurality of M probes to the electrical interface wherein ones of the switches connect selectively one of a first set of the second ones of the plurality of M probes and a second set of the second ones of the plurality of M probes to a set of the electrical connections of the interface such that only one of the first set or the second set is connected to the set of the electrical connections of the interface at a time,
    wherein the first set of the second ones of the plurality of M probes are disposed in the pattern of the M probes to correspond to contact terminals of a first one of the electronic devices, and the second set of the second ones of the plurality of M probes are disposed in the pattern of the M probes to correspond to contact terminals of a second one of the electronic devices.

2. The probe card assembly of claim 1 further comprising:
    a wiring substrate comprising the electrical interface; and
    a probe substrate comprising the probes.

3. The probe card assembly of claim 2, wherein the switches are disposed on the wiring substrate.

4. The probe card assembly of claim 1, wherein the N electrical connections are sufficient to test X of the electronic devices, and the M probes are sufficient to contact Y of the electronic devices, wherein Y is greater than X.

5. The probe card assembly of claim 4 further comprising a sufficient number of the switches to selectively connect one of a first group and a second group of the probes to the electrical interface while disconnecting the other of the first group and the second group from the electrical interface, wherein each of the first group of probes and the second group of probes comprises at least a number of probes sufficient to contact Y minus X electronic devices.

6. The probe card assembly of claim 1, wherein the tester provides test signal for testing semiconductor dies.

7. The probe card assembly of claim 1, wherein the electrical interface makes electrical connections with electronics in a test head, which is electrically connected to the tester.

8. The probe card assembly of claim 7, wherein the test head comprises a plurality of driver circuits and receiver circuits.

9. The probe card assembly of claim 1, wherein at least one of the switches connects selectively one of a first group of electrically connected probes each configured to contact a different electronic device and a second group of electrically connected probes each configured to contact a different electronic device.

10. The probe card assembly of claim 1, wherein the first set of the second ones of the M probes are disposed in the pattern of the M probes to correspond to contact terminals of a first plurality of the electronic devices, and the second set of the second ones of the plurality of M probes are disposed in the pattern of the M probes to correspond to contact terminals of a second plurality of the electronic devices that does not include the first plurality of electronic devices.

11. The probe card assembly of claim 10, wherein the first ones of the M probes are disposed in the pattern of the M probes to correspond to contact terminals of a third plurality of the electronic devices that does not include the first plurality of electronic devices or the second plurality of electronic devices.

12. The probe card assembly of claim 1, wherein the first ones of the M probes comprise a third set of the M probes disposed in the pattern of the M probes to correspond to a third one of the electronic devices that is different than the first one of the electronic devices and the second one of the electronic devices.

13. A probe card assembly comprising:
    a mounting structure by which said probe card assembly can be attached to and detached from a prober;
    an electrical interface comprising N electrical connections configured to make connections with N communications channels from a tester;
    a wiring substrate coupled to the mounting structure and electrically connected to the electrical interface;
    a plurality of M probes disposed on the wiring substrate and arranged to contact terminals of a plurality of electronic devices to be tested, wherein M is greater than N;
    a plurality of electrical connections directly connecting first ones of the plurality of M probes to the electrical interface wherein each one of the electrical connections connects one of the first ones of the plurality of M probes to one of the electrical connections of the interface;
    a plurality of switches configured to selectively connect second ones of the plurality of M probes to the electrical interface wherein the N electrical connections are sufficient to test X of the electronic devices, and the M probes are sufficient to contact Y of the electronic devices, wherein Y is greater than X; and
    the probe card assembly further comprising a sufficient number of switches to selectively connect one of a first group and a second group of the second ones of the plurality of M probes to the electrical interface while disconnecting the other of the first group and the second group from the electrical interface, wherein each of the first group of probes and the second group of probes comprises at least a number of probes sufficient to contact Y minus X electronic devices;
    such that said electronic devices are capable of being tested by bringing the electronic devices into contact with said probes.

14. The probe card assembly of claim 13, wherein each of the switches is configured to connect selectively one of a pair of the probes to one of the electrical connections of the interface.

15. The probe card assembly of claim 13, wherein the switches are disposed on the wiring substrate.

16. The probe card assembly of claim 13, wherein the tester is configured to provide test signal for testing semiconductor dies.

17. The probe card assembly of claim 13, wherein the electrical interface is configured to make electrical connections with electronics in a test head, which is electrically connected to the tester.

18. The probe card assembly of claim 17, wherein the test head comprises a plurality of driver circuits and receiver circuits.

19. The probe card assembly of claim 13, wherein at least one of the switches is configured to connect selectively one of a first group of electrically connected probes each configured to contact a different electronic device and a second group of electrically connected probes each configured to contact a different electronic device.

20. The probe card assembly of claim 13, wherein the wiring substrate comprises a first substrate on which the electrical interface is disposed, and the probe card assembly further comprises a second substrate on which the probes are disposed.

21. The probe card assembly of claim 13, wherein the wiring substrate comprises a first substrate on which the electrical interface is disposed, and the probe card assembly further comprises a plurality of second substrates on which the probes are disposed.

22. A probe card assembly comprising:
- a mounting structure by which said probe card assembly can be attached to and detached from a prober;
- an electrical interface comprising N electrical connections configured to make connections with N communications channels from a tester;
- a plurality of M probes secured to said mounting structure and further disposed to contact terminals of a plurality of electronic devices to be tested, wherein M is greater than N;
- a plurality of electrical connections directly connecting first ones of the plurality of M probes to the electrical interface wherein each one of the electrical connections connects one of the first ones of the plurality of M probes to one of the electrical connections of the interface; and
- a plurality of switches selectively connecting second ones of the plurality of M probes to the electrical interface wherein each one of the switches connects selectively one of a pair of the second ones of the plurality of M probes to one of the electrical connections of the interface, the probe card assembly further comprising a sufficient number of the switches to selectively connect one of a first group and a second group of the probes to the electrical interface while disconnecting the other of the first group and the second group from the electrical interface, wherein each of the first group of probes and the second group of probes comprises at least a number of probes sufficient to contact Y minus X electronic devices, wherein the plurality of electrical connections directly connecting the first ones of the plurality of M probes to the electrical interface connect to a third group of the probes different than the first group and the second group.

* * * * *